United States Patent
Lai (10) Patent No.: US 9,455,155 B2
(45) Date of Patent: Sep. 27, 2016

(54) SEMICONDUCTOR STRUCTURE AND MANUFACTURING METHOD FOR THE SAME

(71) Applicant: Macronix International Co., Ltd., Hsinchu (TW)

(72) Inventor: Erh-Kun Lai, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 46 days.

(21) Appl. No.: 14/325,415

(22) Filed: Jul. 8, 2014

(65) Prior Publication Data

US 2016/0013127 A1   Jan. 14, 2016

(51) Int. Cl.
| | | |
|---|---|---|
| *H01L 29/792* | (2006.01) | |
| *H01L 21/311* | (2006.01) | |
| *H01L 27/115* | (2006.01) | |
| *H01L 21/3213* | (2006.01) | |

(52) U.S. Cl.
CPC .... *H01L 21/31111* (2013.01); *H01L 21/32133* (2013.01); *H01L 27/1157* (2013.01); *H01L 27/11582* (2013.01)

(58) Field of Classification Search
CPC ............. H01L 27/11582; H01L 27/11556; H01L 21/76802; H01L 21/76877; H01L 23/53271; H01L 21/32133; H01L 23/528; H01L 23/5226
USPC ....................................... 257/529, 741, 324
See application file for complete search history.

(56) References Cited

U.S. PATENT DOCUMENTS 6,657,229 B1 *  12/2003  Eguchi ............... H01L 21/761
                                                          257/67
8,208,279 B2    6/2012  Lue

FOREIGN PATENT DOCUMENTS

TW           201034169 A1      9/2010

OTHER PUBLICATIONS

Orlowski, et al.: "Si, SiGe, Ge, and III-V Semiconductor Nanomembranes and Nanowires Enabled by SiGe Epitaxy"; ECS Transactions, 33 (6) 777-789 (2010) 10.1149/1.3487608 © The Electrochemical Society; pp. 777-789.
TIPO Office Action dated Apr. 22, 2016 in Taiwan application (No. 103123119).

* cited by examiner

*Primary Examiner* — Thien F Tran
(74) *Attorney, Agent, or Firm* — McClure, Qualey & Rodack, LLP (57) ABSTRACT

A semiconductor structure and a manufacturing method of the same are disclosed. The semiconductor structure includes a conductive layer, a conductive strip, a dielectric layer, and a conductive element. The conductive layer has a first conductive material. The conductive strip is in the same level as the conductive layer and has a second conductive material. The second conductive material is adjoined with the first conductive material having a conductivity characteristic different from a conductivity characteristic of the second conductive material. The conductive element crisscrosses the conductive strip and separated from the conductive strip by the dielectric layer.

12 Claims, 12 Drawing Sheets

SEMICONDUCTOR STRUCTURE AND MANUFACTURING METHOD FOR THE SAME

BACKGROUND

1. Technical Field

The disclosure relates in general to a semiconductor structure and a manufacturing method thereof, and particularly to a memory and a manufacturing method thereof.

2. Description of the Related Art

In recent years, the structures of semiconductor devices have been changed constantly, and the storage capacity of the devices has been increased continuously. Memory devices are used in storage elements for many products such as MP3 players, digital cameras, computer files, etc. As the application increases, the demand for the memory device focuses on small size and large memory capacity. For satisfying the requirement, a memory device having a high element density and a small size and the manufacturing method thereof is in need.

As such, it is desirable to develop a three-dimensional (3D) memory device with larger number of multiple stacked planes to achieve greater storage capacity, a small size, and yet having excellent property and stability.

SUMMARY

According to an embodiment of the present disclosure, a semiconductor structure is provided. The semiconductor structure comprises a conductive layer, a conductive strip, a dielectric layer, and a conductive element. The conductive layer has a first conductive material. The conductive strip is in the same level as the conductive layer and has a second conductive material. The second conductive material is adjoined with the first conductive material having a conductivity characteristic different from a conductivity characteristic of the second conductive material. The conductive element crisscrosses the conductive strip and separated from the conductive strip by the dielectric layer.

According to another embodiment of the present disclosure, a method for manufacturing a semiconductor structure is provided. The method comprises following steps. A first hole is formed in the stack structure to expose a conductive film having a first conductive material of the stack structure. A dielectric layer is formed in the first hole. The first hole is filled with a conductive plug. A second hole is formed in the stack structure to expose the dielectric layer and the conductive film. A portion of the conductive film exposed by the second hole is removed to form a trench extending outward from the second hole. The trench is filled with a second conductive material. The second hole is filled with a dielectric plug.

The above and other embodiments of the disclosure will become better understood with regard to the following detailed description of the non-limiting embodiment(s). The following description is made with reference to the accompanying drawings.

BRIEF DESCRIPTION OF THE DRAWINGS

FIG. 1A to FIG. 9 illustrate a manufacturing method for a semiconductor structure according to embodiments.

DETAILED DESCRIPTION

FIG. 1A to FIG. 9 illustrate a manufacturing method for a semiconductor structure according to embodiments.

2

Figure 1A:
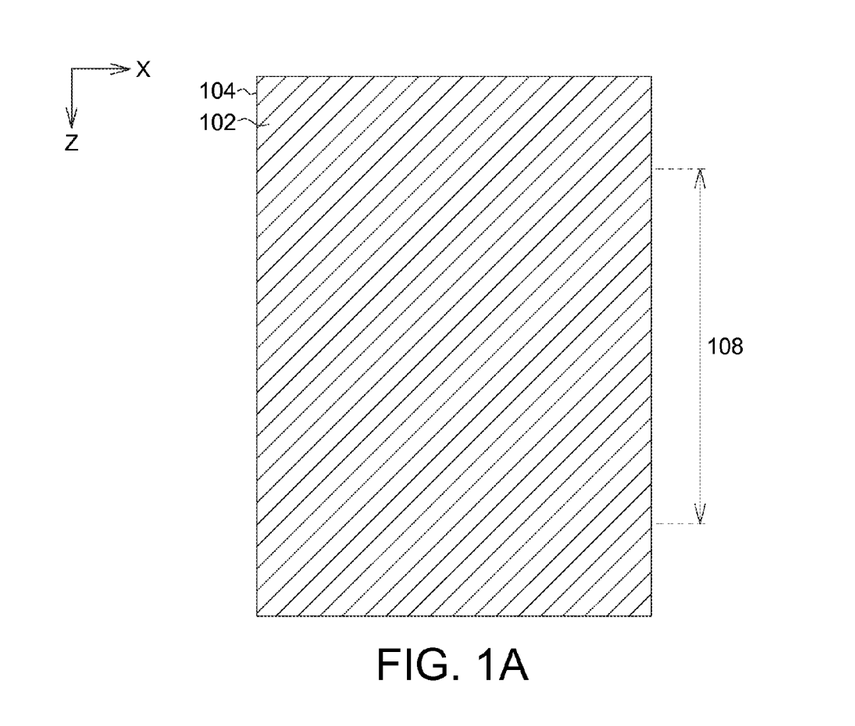
Figure 1B:
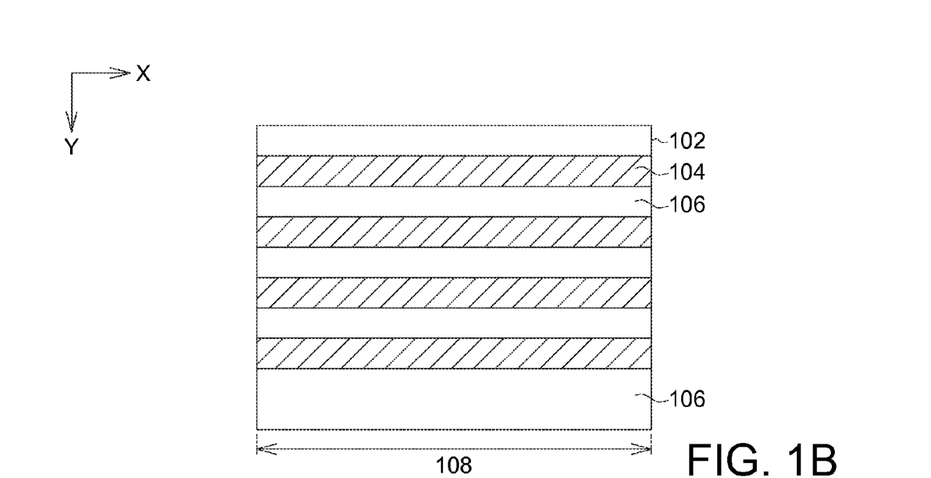

Referring to FIG. 1A and FIG. 1B, which are a top view and a cross-section view of the semiconductor structure respectively, a stack structure 102 comprises conductive films 104 and dielectric films 106 stacked alternately on a substrate (not shown). For sake of brevity, the figures marked with "A" in the present disclosure only shows a structure of one level of the conductive film 104. The substrate may comprise a silicon wafer, an epitaxial or doped layer formed on a silicon material, a SOI, or other suitable substrate structures. The conductive film 104 is formed by a first conductive material. The dielectric film 106 is formed by an oxide.

Figure 2A:
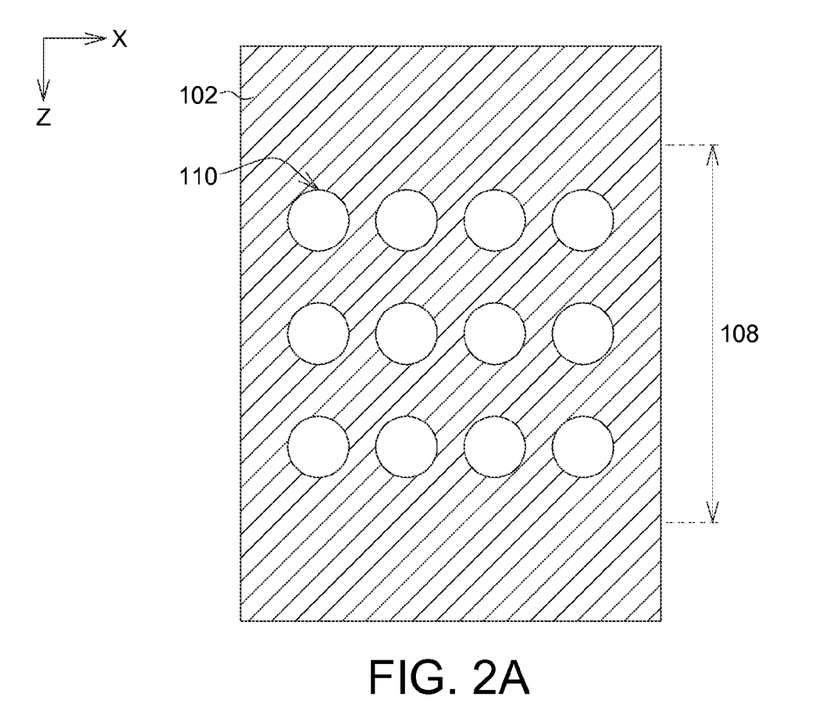
Figure 2B:
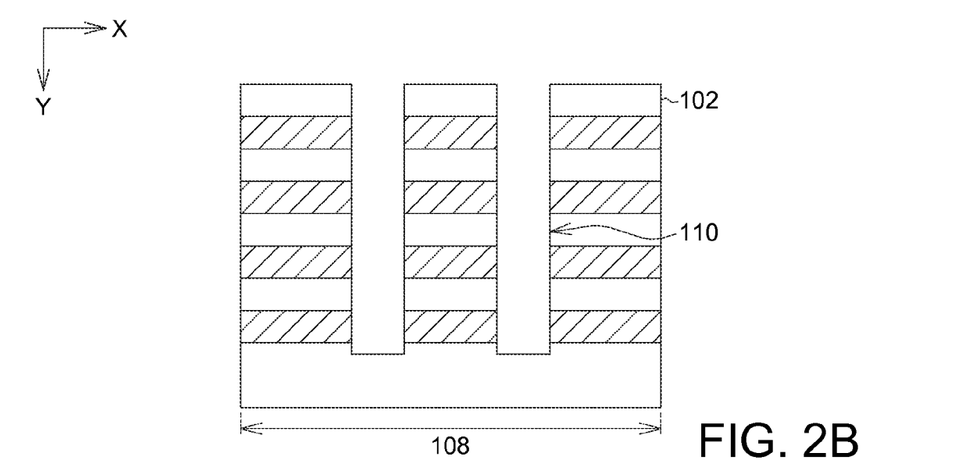

Referring to FIG. 2A and FIG. 2B, a first hole 110 may be formed in the stack structure 102 in a memory array region 108 by an etching step with a lithography technique. The figures marked with "B" in the present disclosure shows a structure near the first hole 110. The first hole 110 may be stopped on the bottom dielectric film 106 by controlling an etching time.

Figure 3A:
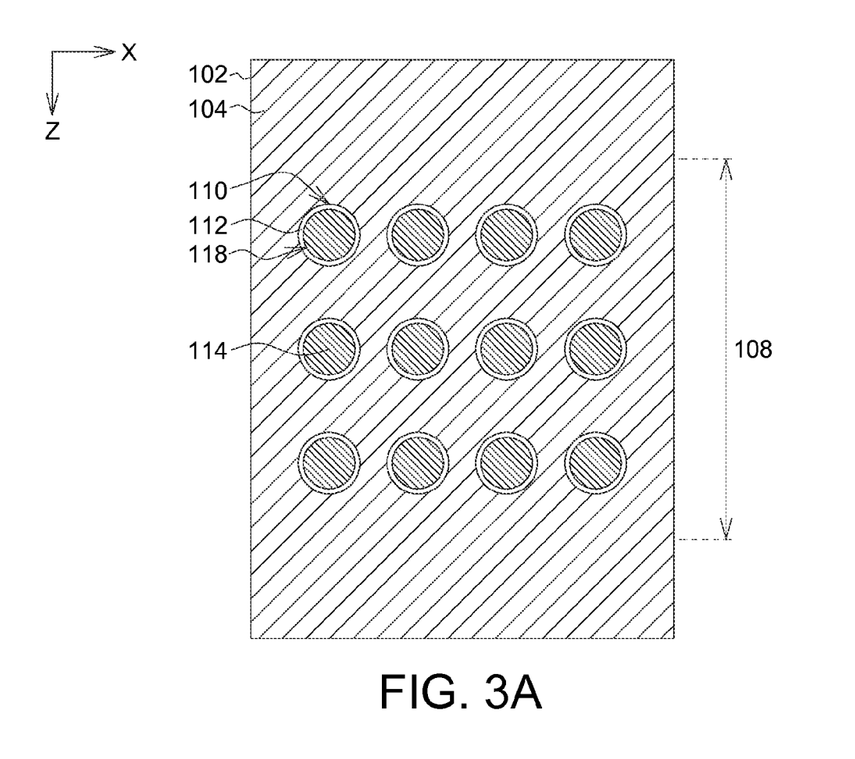
Figure 3B:
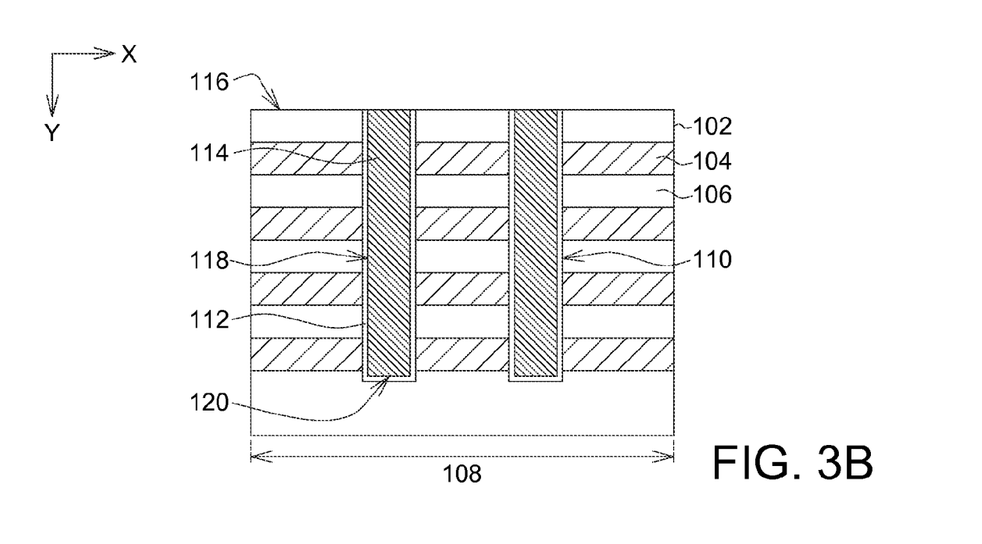

Referring to FIG. 3A and FIG. 3B, a dielectric layer 112 is formed on the conductive film 104 and the dielectric film 106 exposed by the first hole 110. The first hole 110 is filled with a conductive material to form a conductive plug 114. In some embodiments, a CMP process may be performed to remove the conductive material (not shown) on an upper surface 116 of the stack structure 102. As shown in FIG. 3B, the dielectric layer 112 is on a sidewall 118 and a lower surface 120 of the conductive plug 114. The dielectric layer 112 may be an ONO structure, an ONONO structure, an ONONONO structure, or a multi-layer structure of tunneling material/trapping material/blocking material, for NAND storage. The O1N1O2 material is for the tunneling material. The N2 material is for the trapping material. The O3/N3/O4 is for the blocking material.

Figure 4A:
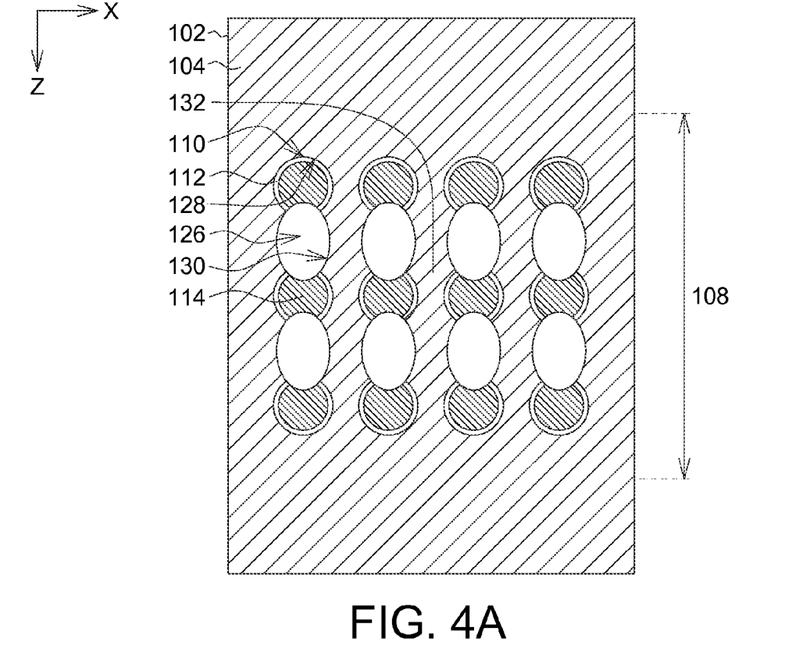
Figure 4B:
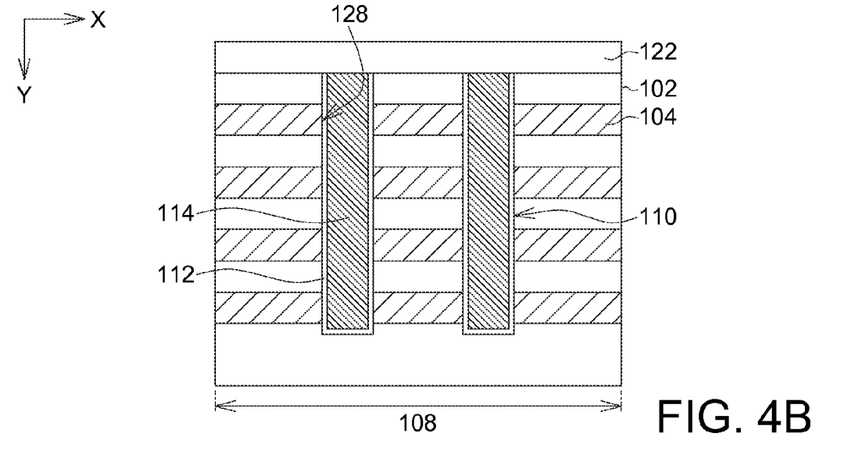
Figure 4C:
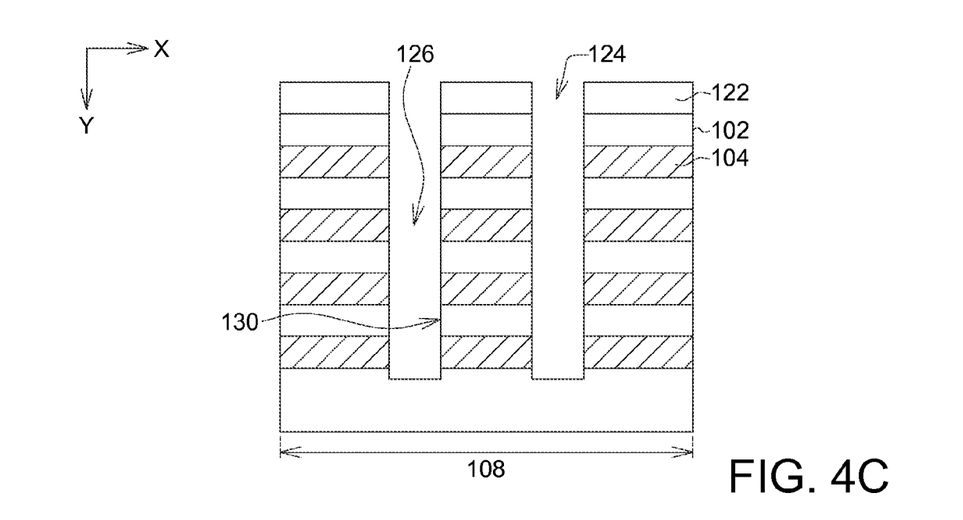

Referring to FIG. 4A to FIG. 4C, a patterned mask layer 122 (not shown in FIG. 4A for the sake of brevity) is formed on the stack structure 102. An opening 124 of the mask layer 122 in the memory array region 108 is transferred down to the stack structure 102 to form a second hole 126. The figures marked with "C" in the present disclosure show a structure near the second hole 126. The mask layer 122 may comprises a photo-resist or other suitable materials such as silicon nitride. The mask layer 122 may be patterned by an etching step with a lithography technique.

Referring to FIG. 4A, the second hole 126 is adjoined with the first holes 110 arranged along the Z direction, and exposes at least the dielectric layer 112 in the first hole 110. In some embodiments, the second hole 126 may further expose the conductive plug 114 in the first hole 110. By this step, a profile 132 for a conductive strip extending in the Z direction is define out by and between groups of connecting sidewalls 128 and 130 in the Z direction of the first hole 110 and the second hole 126.

Figure 5A:
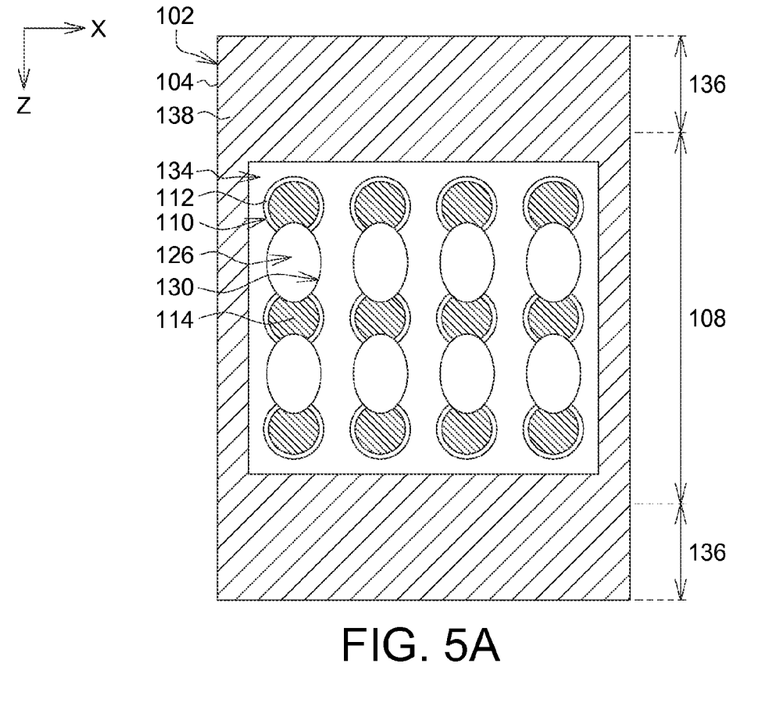
Figure 5B:
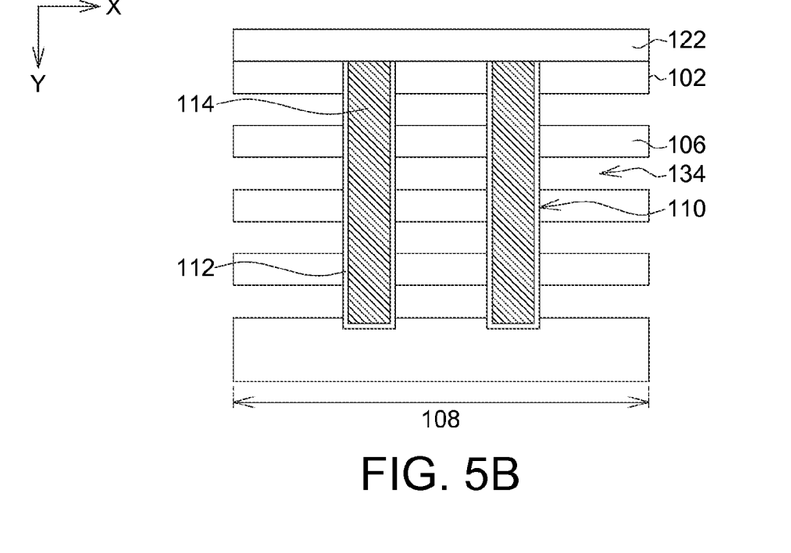
Figure 5C:
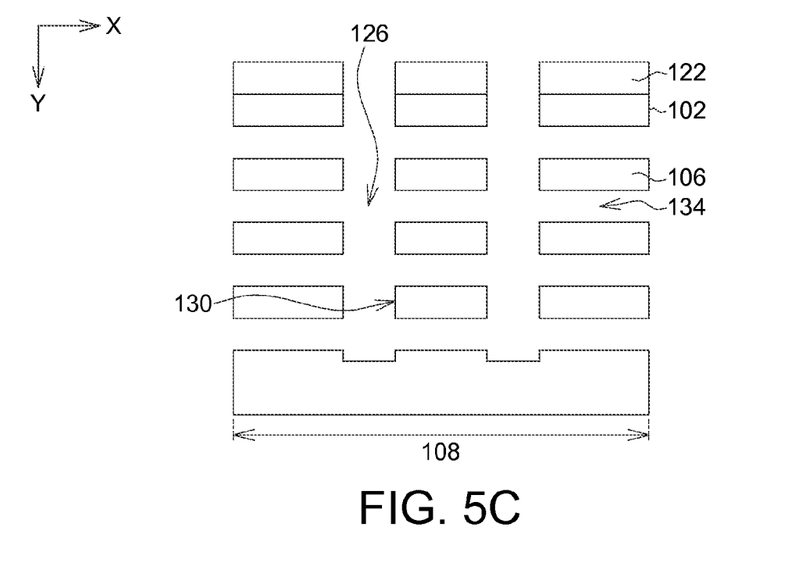

Referring to FIG. 5A to FIG. 5C, a portion of the conductive film 104 exposed by the second hole 126 in the memory array region 108 is removed to form a trench 134 extending outward from a sidewall 130 of the second hole 126 (i.e. the sidewall 130 of the dielectric film 106 and between the dielectric films 106; and a portion of the conductive film 104 in a pad region 136 not overlapping with the memory array region 108 is remained to form a conductive layer 138. In embodiments, the conductive film 104 is removed by an etching step etching the conductive film 104 (or the first conductive material) with an etching rate faster than etching rates to the dielectric layer 112, the conductive plug 114, the dielectric film 106, or/and the mask layer 122, or etching substantially none of the dielectric layer 112, the conductive plug 114, the dielectric film 106, and/or the mask layer 122. The etching step may be an isotropic process, comprising a wet etching method, a dry etching method, etc. For example, in a case of the first conductive material of polysilicon, the removal method may comprise a dry etching using $CF_4/O_2/N_2$ gases, a wet etching using a tetramethylammonium hydroxide (TMAH) or hot ammonia, etc. An outside edge profile of the trench 134 is not limited to a rectangle shape shown in figures, and may be varied into other shapes such as a ring shape or irregular shapes, etc. according to etching conditions.

In some embodiments, although the trench 134 is formed with a big area, the dielectric films 106 of different levels in the memory array region 108 can be maintained at a desired separating condition, in other words the trench 134 can have a desired space, since the dielectric layer 112 and the conductive plug 114 in the first hole 110 can support the dielectric films 106 on and under the trench 134 to separate from each other, and the stack structure 102 in other regions such as the pad region 136 without the trench 134 formed therein can also provide supporting to the stack structure 102 in the memory array region 108.

Figure 6A:
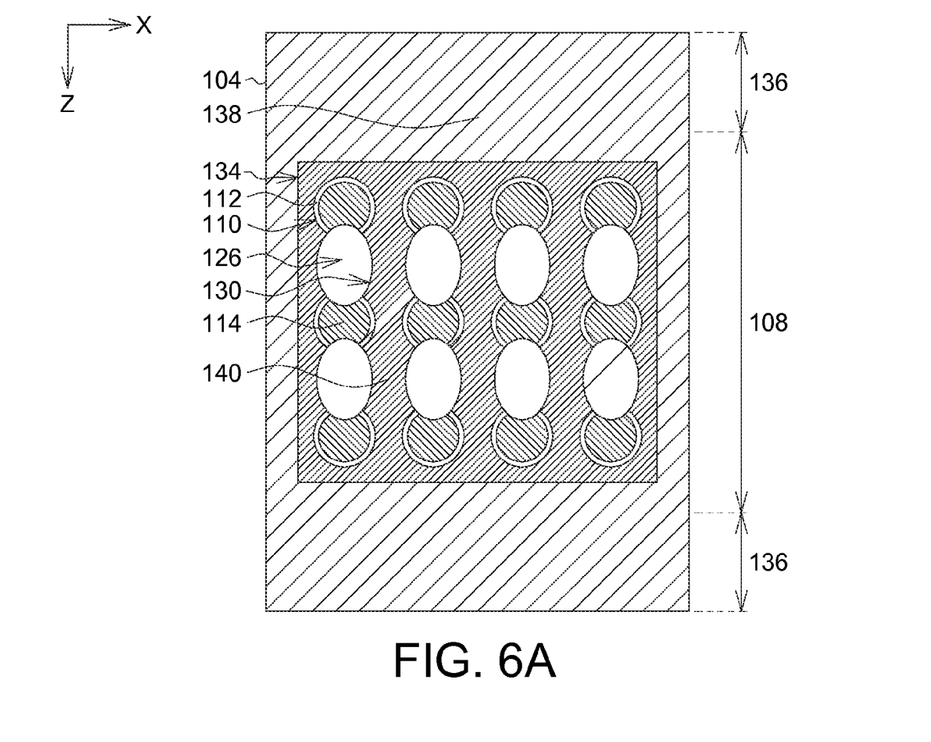
Figure 6B:
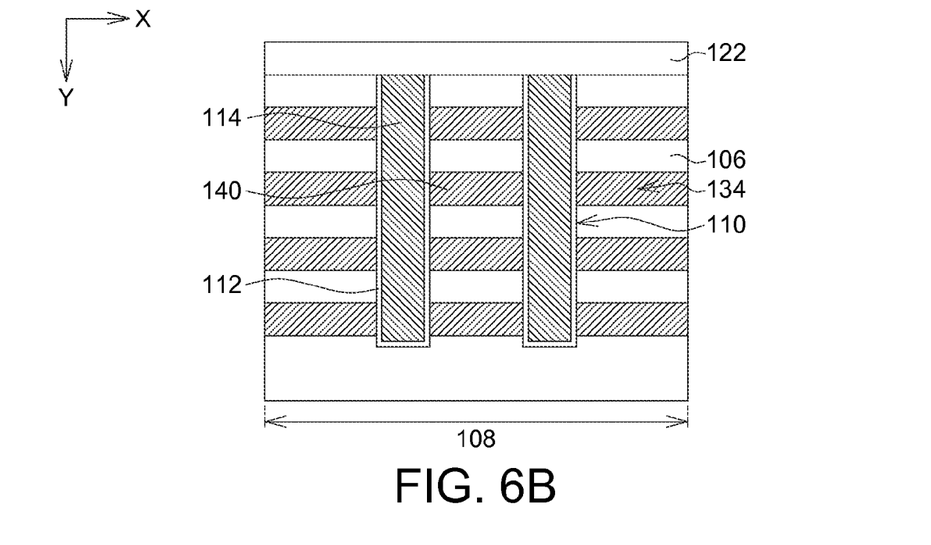
Figure 6C:
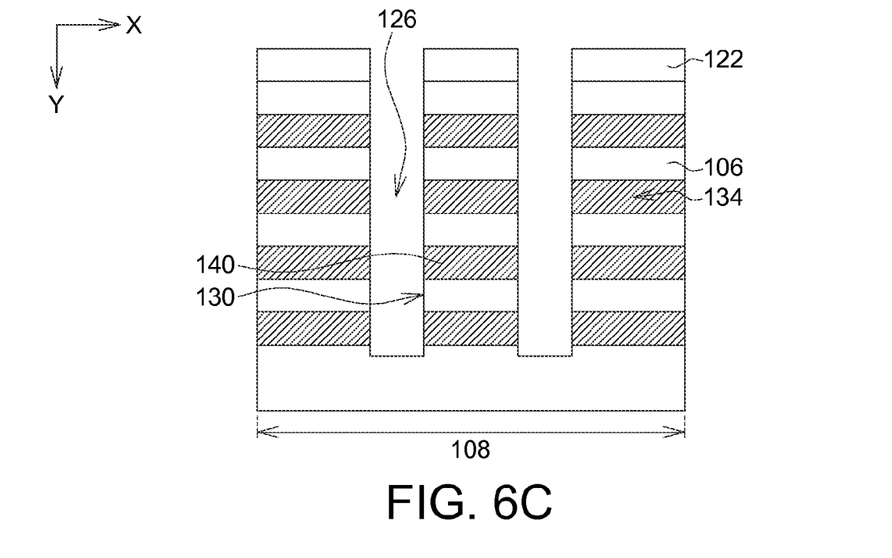

Referring to FIG. 6A to FIG. 6C, the trench 134 is filled with a second conductive material to form conductive strips 140 extending in the Z direction and separated from each other. In embodiments, the conductive strips 140 of different levels are formed by the same deposition process at the same time, and therefore have a uniform material characteristic substantially. In some embodiments, the second conductive material may be annealed by a method such as laser annealing process to improve material property.

As shown in FIG. 6A, the second conductive material filling in the trench 134 is adjoined with the remained portion of the conductive film 104 (or the conductive layer 138), so that the conductive strip 140 in the memory array region 108 is electrically connected to the conductive layer 138 in the pad region 136. Each of conductive levels comprises the conductive layer 138 and the conductive strip 140. In some embodiments, the second conductive material (not shown) deposited in the second hole 126 or on the sidewall 130 of the dielectric film 106 is removed by an isotropic etching process using the mask layer 122, so as to avoid a short connection between the second conductive materials in the trenches 134 of different levels.

Figure 7A:
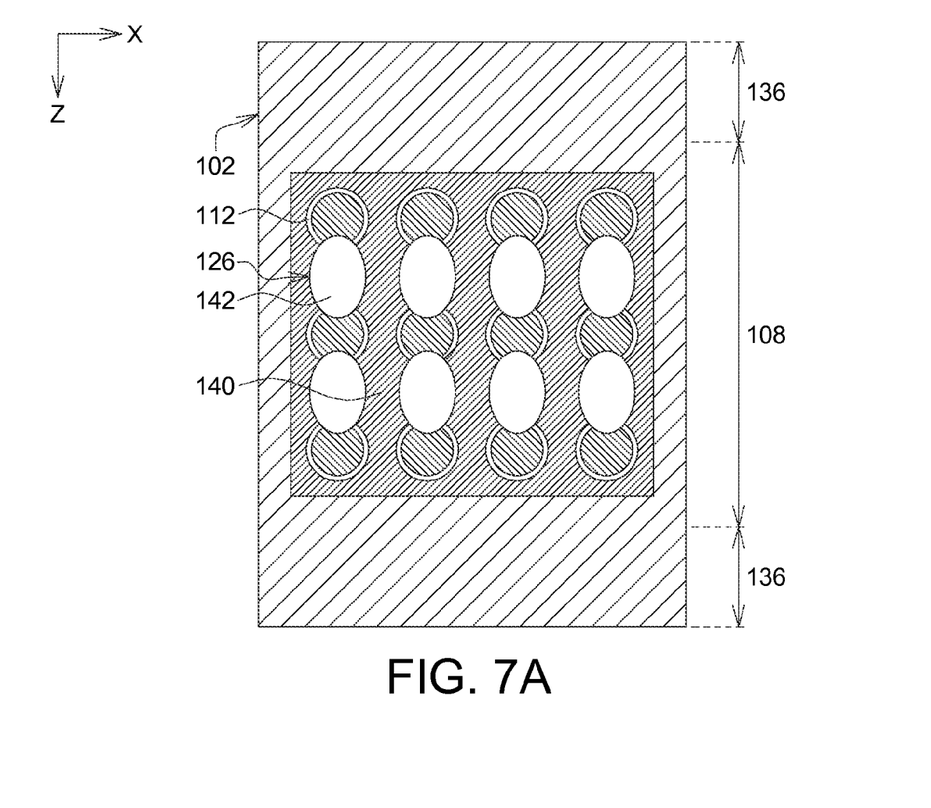
Figure 7B:
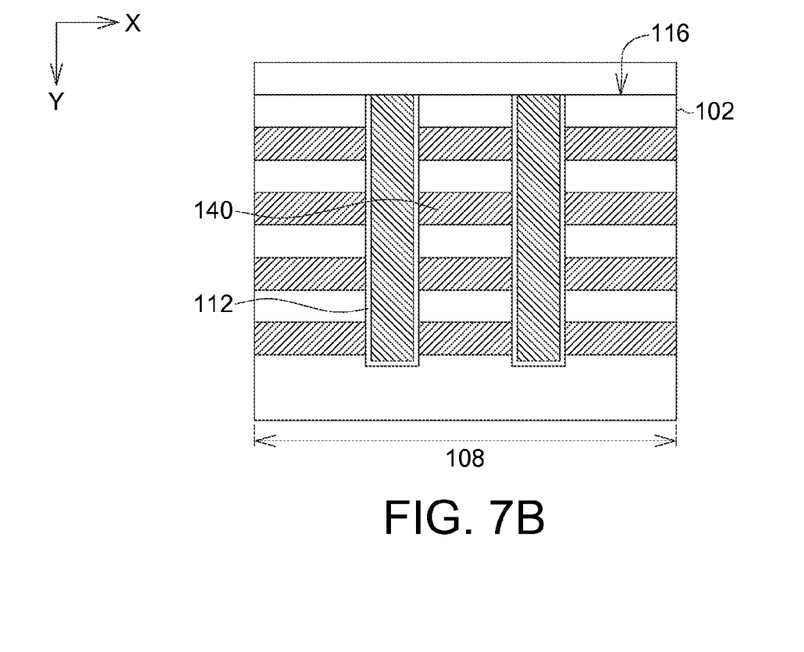
Figure 7C:
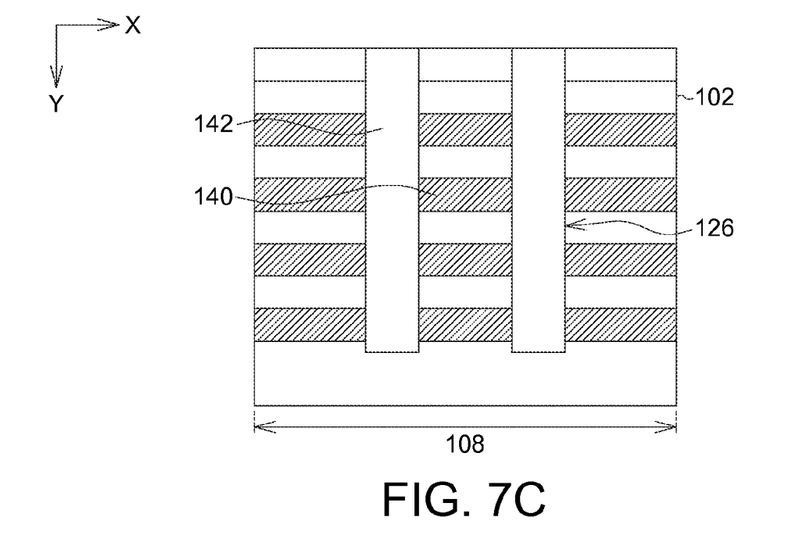

Referring to FIG. 7A to FIG. 7C, the second hole 126 is filled with a dielectric material to form a dielectric plug 142. As shown in FIG. 7A, the conductive strip 140 is defined by the dielectric layer 112 and the dielectric plug 142 adjoined with each other. In one embodiment, the dielectric plug 142 is an oxide.

Figure 8A:
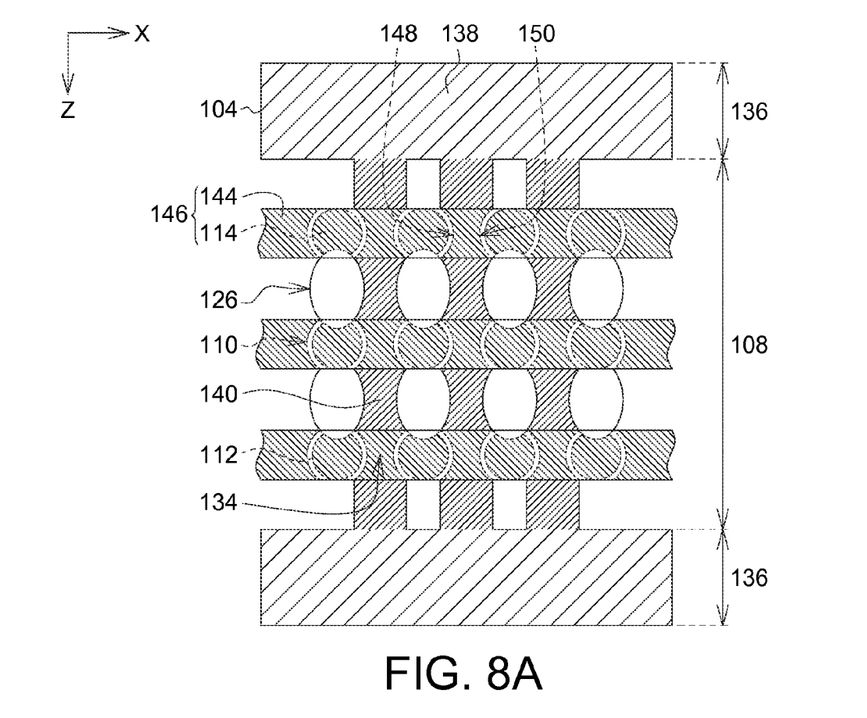
Figure 8B:
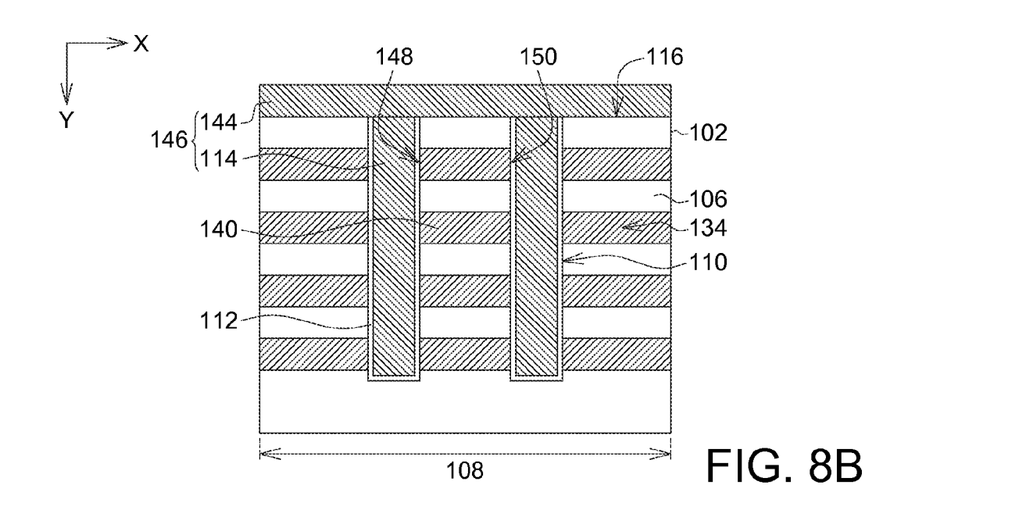
Figure 8C:
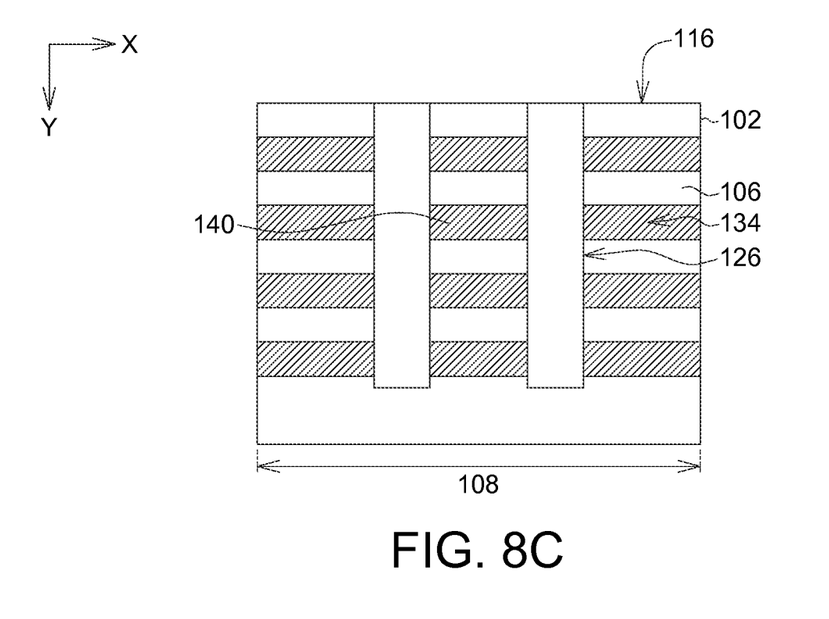

Referring to FIG. 8A to FIG. 8C, a CMP process may be performed to remove the dielectric material (not shown) and the mask layer 122 (FIG. 7B and FIG. 7C) on the upper surface 116 of the stack structure 102. In other embodiments, the mask layer 122 may be remained, or removed at other suitable timings.

Referring to FIG. 8A to FIG. 8B, conductive connections 144 extending in the X direction and separated from each other are formed on the conductive plugs 114. The conductive connection 144 crosses the conductive strip 140 between the conductive plugs 114. A conductive element 146 comprising the conductive connection 144 and the conductive plug 114 adjoined with the conductive connection 144 crisscrosses the conductive strip 140, and is separated from the conductive strip 140 by the dielectric layer 112. The conductive connection 144 and the conductive plug 114 may be formed by a third conductive material. The conductive connection 144 may be formed by a method comprising depositing the third conductive material on the stack structure 102, and patterning the third conductive material by an etching step with a lithography technique.

In embodiments, the semiconductor structure is a 3D vertical gate NAND flash memory stack. In the memory array region 108, the conductive strip 140 extending in the Z direction is functioned as a bit line, and the conductive element 146 extending in the X direction is functioned as a word line.

In some comparative examples, bit lines are formed by a pattering method in which openings of long strip shape are once defined in the stack structure of the conductive films and the dielectric films. In other words, during the formation process, the whole of sidewalls of the bit lines are exposed to the openings, without being supported by other elements. However, in this condition, bending would easily occur to the bit lines of high aspect ratio due to other stress effect for example resulted from a solution filling in the openings, or dipping-in or pulling-out actions during a dip clean process. The bending damage would result in un-desired short circuit and reduce product yield.

In embodiments of the present disclosure, the profile for the conductive strips 140 of each level is defined by holes formed different steps, comprising the first hole 110 and the second hole 126. During the formation process, the second conductive material for the conductive strip 140 is supported. For example, in the step disclosed referring to FIG. 6A to FIG. 6C, the second conductive material filling in the trench 134 is supported by the dielectric film 106, and the dielectric layer 112 and the conductive plug 114 in the first hole 110. Therefore, compared to the comparative example, embodiment has a stronger structure characteristic that would not easily have bending problem, and higher reliability.

According to electrical demands for the device, the first conductive material for the conductive layer 138 (or the remained portion of the conductive film 104, the second conductive material for the conductive strip 140, and the third conductive material for the conductive element 146 may be designed to have different conductive characteristics. In some designs, the conductive layer 138 of a pick-up region for bit line should have an electric resistance smaller than an electric resistance of the bit line usually being in normally-off state. Therefore, an electric resistance of the first conductive material should be smaller than an electric resistance of the second conductive material. In one embodiment, the first conductive material is a doped silicon-containing material, such as N+ polysilicon. The second conductive material is an un-doped silicon-containing material or intrinsic silicon, such as un-doped polysilicon. The third conductive material is P+ SiGe.

The conductive plugs 114 of the conductive element 146 (word lines) on opposing sidewalls 148, 150 of the conductive strips 140 are formed by a self-aligning filling into the first holes 110, as disclosed referring to FIG. 3A and FIG. 3B. Therefore, the structure the can have a precise desired feature to increase product yield.

As disclosed referring to FIG. 6A to FIG. 6C, the second conductive materials in the different levels can be simultaneously formed by the same deposition process, and thus the conductive strips 140 in the memory array region 108 can have a substantial uniform material property. Therefore, the bit line channels for each memory in the array can have substantially the same electrical characteristics, so as to improve device efficiency.

Figure 9:
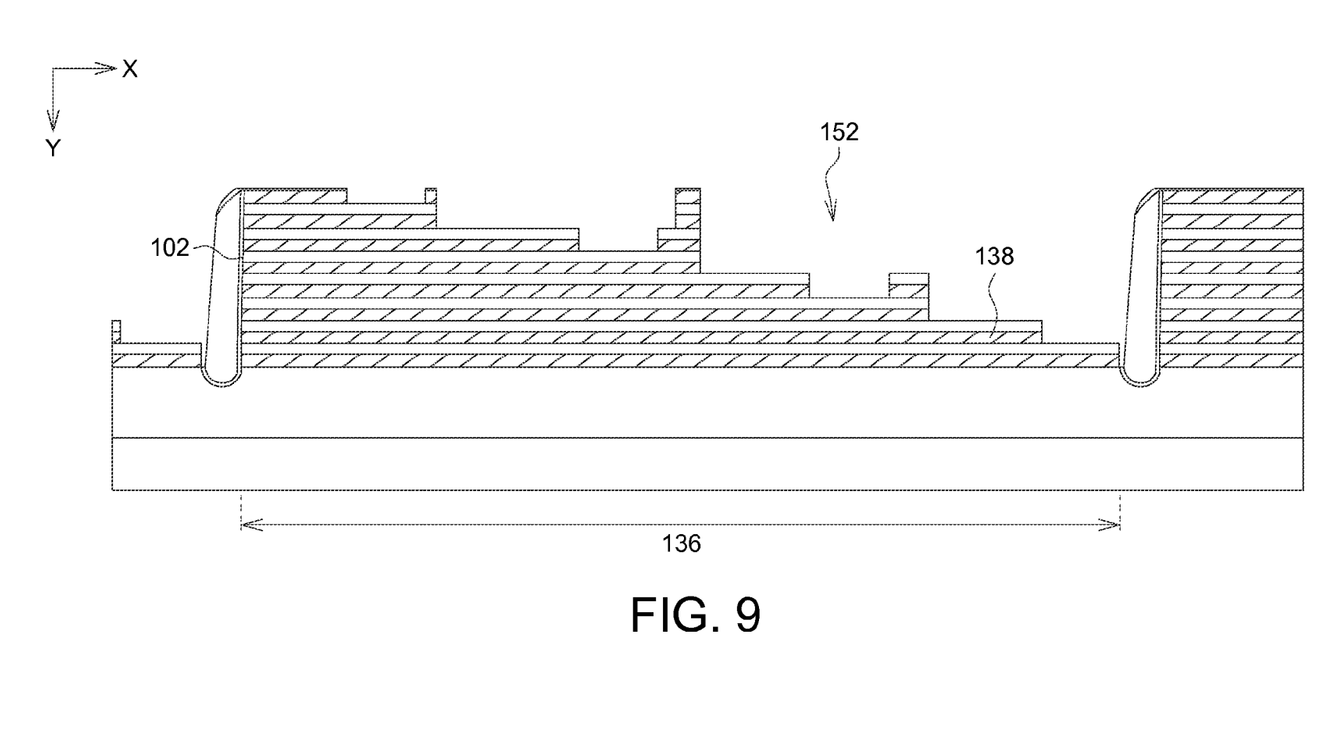

Referring to FIG. 9, in other embodiments, openings 152 of different depths are formed in the stack structure 102 in the pad region 136 to expose the conductive layers 138 of different levels, respectively.

Other process (not shown) may be performed following the openings 152. For example, the openings 152 may be filled with a dielectric, and contact plugs are formed to pass through the dielectric to electrically connect to the conductive layer 138. In addition, other architectures, such as conductive contacts or metal layers such as M1, M2, etc, electrically connecting to the contact plugs or word lines may be formed above the stack structure 102. In some embodiments, for example, additional steps may be performed at a timing between the steps disclosed referring the figures. The sequence of the steps disclosed referring the figures may be properly varied.

The present disclosure is not limited to the illustrations according to the above embodiment drawings, and can be adjusted according to actual demands and other suitable designs. In an another embodiment, for example, the first conductive material for the conductive layer 138 uses N+ SiGe, the second conductive material for the conductive strip 140 uses an intrinsic or un-doped SiGe, and the third conductive material for the conductive element 146 uses P+ polysilicon. In addition, in the step for removing the first conductive material of SiGe in the memory array region 108, a chemical plasma etching with a using a pure $CF_4$ etching gas; a HCl etching; or a wet etching using $HF/HNO_3/CH_3COOH$ etchant, may be utilized. The conductive material for the elements may comprise a meal such as TiN, Ti, TaN, Ta, Au, W, etc, or suitable metal silicides. The dielectric for the dielectric film, the dielectric layer, the dielectric plug, or other insulating elements may comprise an oxide, a nitride, an oxynitride, such as silicon oxide, silicon nitride, silicon oxynitride, or other suitable dielectric materials, and may have a single-layer structure or a multi-layer structure. The dielectric material or the conductive material may be formed by any suitable method, comprising a PVD method, a CVD method, etc. The etching or removal steps may comprise a wet etching, a dry etching, etc.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a conductive layer having a first conductive material;
   a dielectric layer; and
   a stack of conductive levels each comprising a conductive layer and a conductive strip, wherein
   the conductive strip is in the same level as the conductive layer and has a second conductive material, wherein the second conductive material is adjoined with the first conductive material having a conductivity characteristic different from a conductivity characteristic of the second conductive material,
   a conductive element crisscrosses the conductive strip and is separated from the conductive strip by the dielectric layer.

2. The semiconductor structure according to claim 1, wherein the conductive layers of the different levels are exposed by openings of different depths in the stack.

3. The semiconductor structure according to claim 1, comprising a memory array region and a pad region adjacent to the memory array region, wherein the conductive strip is in the memory array region, the conductive layer is in the pad region.

4. The semiconductor structure according to claim 3, wherein the memory array region and the pad region are non-overlapping.

5. The semiconductor structure according to claim 1, wherein the conductive element comprises a conductive plug, the dielectric layer is on a sidewall and a lower surface of the conductive plug.

6. The semiconductor structure according to claim 1, wherein the first conductive material is a doped silicon-containing material, the second conductive material is an un-doped silicon-containing material.

7. The semiconductor structure according to claim 1, wherein the conductive element has a third conductive material different from the first conductive material and the second conductive material.

8. The semiconductor structure according to claim 1, wherein the conductive element comprising a conductive plug and a conductive connection adjoined with the conductive plug, the conductive plug is on opposing sidewalls of the conductive strip, the conductive connection is above an upper surface of the conductive strip.

9. The semiconductor structure according to claim 1, further comprising a dielectric plug, wherein the conductive strip is defined by the dielectric layer and the dielectric plug adjoined with the dielectric layer.

10. The semiconductor structure according to claim 1, wherein the conductive strip and the conductive element are used as a bit line and a word line for a memory respectively.

11. A semiconductor structure, comprising:
    a memory array region and a pad region adjacent to the memory array region;
    a conductive layer having a first conductive material and being in the pad region;
    a conductive strip in the same level as the conductive layer and having a second conductive material, wherein the second conductive material is adjoined with the first conductive material having a conductivity characteristic different from a conductivity characteristic of the second conductive material, the conductive strip is in the memory array region;
    a dielectric layer; and
    a conductive element crisscrossing the conductive strip and separated from the conductive strip by the dielectric layer.

12. A semiconductor structure, comprising:
    a conductive layer having a first conductive material;
    a conductive strip in the same level as the conductive layer and having a second conductive material, wherein the second conductive material is adjoined with the first conductive material having a conductivity characteristic different from a conductivity characteristic of the second conductive material;
    a dielectric layer; and
    a conductive element crisscrossing the conductive strip and separated from the conductive strip by the dielectric layer, wherein the conductive strip and the conductive element are used as a bit line and a word line for a memory respectively.

* * * * *